United States Patent [19]
Hynecek

[11] Patent Number: 5,567,641
[45] Date of Patent: Oct. 22, 1996

[54] METHOD OF MAKING A BIPOLAR GATE CHARGE COUPLED DEVICE WITH CLOCKED VIRTUAL PHASE

[75] Inventor: Jaroslav Hynecek, Richardson, Tex.

[73] Assignee: Texas Instruments Incorporated, Dallas, Tex.

[21] Appl. No.: 437,121

[22] Filed: May 5, 1995

Related U.S. Application Data

[62] Division of Ser. No. 401,321, Mar. 9, 1995, Pat. No. 5,502,318, which is a continuation of Ser. No. 196,045, Feb. 14, 1994, abandoned.

[51] Int. Cl.⁶ .................................................. H01L 21/70
[52] U.S. Cl. ........................... 437/53; 437/26; 437/27; 257/247
[58] Field of Search ............................ 437/53, 2, 26, 437/27, 31, 968; 257/247

[56] References Cited

U.S. PATENT DOCUMENTS

| | | | |
|---|---|---|---|
| 4,032,952 | 6/1977 | Ohba et al. | 257/224 |
| 4,083,098 | 4/1978 | Nicholas | 437/53 |
| 4,151,539 | 4/1979 | Barron et al. | 257/217 |
| 4,229,752 | 10/1980 | Hynecek | 257/217 |
| 4,300,151 | 11/1981 | Nishizawa | 257/217 |
| 4,402,128 | 9/1983 | Blackstone | 437/53 |
| 4,612,521 | 9/1986 | Kleefstra et al. | 257/216 |
| 4,779,124 | 10/1988 | Hynecek | 257/217 |
| 4,814,844 | 3/1989 | Bluzer | 257/247 |
| 4,992,392 | 2/1991 | Nichols et al. | 437/53 |
| 5,001,530 | 3/1991 | Kurianski et al. | 257/217 |
| 5,151,380 | 9/1992 | Hynecek | 437/53 |
| 5,286,990 | 2/1994 | Hynecek | 257/247 |

*Primary Examiner*—Trung Dang
*Attorney, Agent, or Firm*—Alan K. Stewart; Richard L. Donaldson; William E. Hiller

[57] ABSTRACT

The charge coupled device cell has a semiconductor layer 20 of a first conductivity type, a buried channel 22 of a second conductivity type on the semiconductor layer 20, a first virtual gate 24 in the buried channel 22, the first virtual gate is switched between at least two potential levels, and a first bipolar gate 42 in the buried channel 22 adjacent the first virtual gate 24.

4 Claims, 4 Drawing Sheets

METHOD OF MAKING A BIPOLAR GATE CHARGE COUPLED DEVICE WITH CLOCKED VIRTUAL PHASE

This is a Divisional of application Ser. No. 08/401,321, filed on Mar. 9, 1995, now U.S. Pat. No. 5,502,318 which is a FWC Cont. of Ser. No. 08/196,045, filed on Feb. 14, 1994 now abandoned. Title: Bipolar Gate Charge Coupled Device with Clocked Virtual Phase

FIELD OF THE INVENTION

This invention generally relates to semiconductor devices and more particularly to charge coupled devices.

BACKGROUND OF THE INVENTION

Without limiting the scope of the invention, its background is described in connection with charge coupled device (CCD) image sensors, as an example. A typical CCD consists of several gate levels (usually polysilicon) which are used to control the potential within the silicon bulk. By applying suitable bias to the gates, the potential is modulated which in turn causes charge transfer. Virtual phase CCD was developed to minimize the number of polysilicon levels. This resulted in many advantages such as better quantum efficiency and lower dark current (elimination of surface state component of the dark current). In the virtual phase CCD one polysilicon level has been eliminated and replaced by a P+ junction. This P+ junction region is connected to the substrate through an undepleted channel stop region. Virtual phase CCD can be characterized by alternative placement of a MOS structure with JFET structures in a coupled chain. By clocking the MOS gates charge is transferred, while the JFET region potential is fixed. The potential steps which provide the necessary directionality for the charge transfer are usually created by a suitable ion implantation. It is not necessary to connect the virtual phase region to the substrate through the channel stops. Other methods are possible. See for example "Method of Making Top Buss Virtual Phase Frame Interline Transfer CCD Image Sensor", U.S. Pat. No. 5,151,380.

A CCD with no MOS gate has been developed by M. Kleefstra "First Experimental Bipolar CCD" Microelectronics, vol 7 pp. 68–69, December 1975. In this CCD the JFETS are placed side-by-side with small gaps between them. By careful control of potential profile in the gaps it is possible to achieve charge transfer and not have electrode-to-electrode shorts or large leakage currents. The control of the inter-electrode spacing, doping profile, and thus potential is crucial to this device. It is difficult to obtain a complete satisfaction of all the parameters. Improvement of this concept has been described in "Virtual Phase Buried Channel CCD", U.S. Pat. No. 4,779,124. In this structure, the virtual phase electrode remains as it existed in the virtual phase CCD. The MOS gate has been replaced by an "N+P" junction. P layer under the N+ region (gate) provides the necessary barrier to prevent the electrons from the N+ region to flow into the N type buried channel. In this structure there is no current flow from one P+ or N+ region to the other. The inter-electrode leakage and shorts have been eliminated. It is also much easier to control the potential profile between the electrodes and thus achieve smooth transitions with excellent charge transfer efficiency. The charge transfer directionality is built into the structure by a suitable ion implantation.

SUMMARY OF THE INVENTION

It has been discovered that small well capacity of the clocked regions and large clocked gate potential swing of the prior art junction gate CCD is a problem. This causes reverse breakdown between the N+ and P+ electrodes which limits the performance.

Generally, and in one form of the invention, the charge coupled device cell has a semiconductor layer of a first conductivity type, a buried channel of a second conductivity type on the semiconductor layer, a first virtual gate in the buried channel, the first virtual gate is switched between at least two potential levels, and a first bipolar gate in the buried channel adjacent the first virtual gate.

This invention provides several advantages such as high quantum efficiency, low dark current, and good inter-electrode potential control for an excellent charge transfer efficiency.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
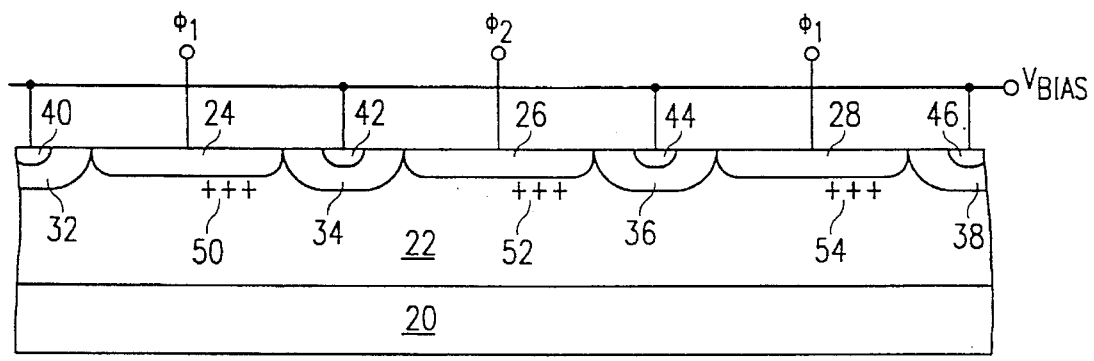
FIG. 1 is a cross-section of a preferred embodiment bipolar gate CCD with clocked virtual phase.

FIG. 1 is a cross-section of a preferred embodiment of a bipolar gate CCD with clocked virtual phase. The structure of FIG. 1 includes a P type layer 20, an N type layer 22 in P type layer 20, P+ virtual gates 24, 26, and 28 formed in the upper portion of N type layer 22, P type regions 32, 34, 36, and 38 formed in the upper portion of N type layer 22 adjacent the P+ virtual gates 24, 26, and 28, N+ bipolar gates 40, 42, 44, and 46 formed in the P type regions 32, 34, 36, and 38, donor implants 50, 52, and 54 in the N type layer 22 below virtual gates 24, 26, and 28, reference voltage $V_{bias}$ coupled to the bipolar gates 40, 42, 44, and 46, clocked voltage $\phi_1$ coupled to virtual gates 24 and 28, and clocked voltage $\phi_2$ coupled to virtual gate 26.

In the device of FIG. 1, the bipolar gates 40, 42, 44, and 46 do not store charge. The bipolar gates are DC biased to a reference voltage $V_{bias}$. The virtual gates 24, 26, and 28 are not connected to the substrate. The virtual gates are separately clocked to achieve the charge transfer. The resulting clock swing for the virtual gates is much smaller than when the bipolar gates are clocked, which lowers the field in the N+ regions 40, 42, 44, and 46, and P+ regions 24, 26, and 28. This allows the well capacity to be increased without the problem of breakdown. The directionality of the charge transfer is built into the structure by the donor implants 50, 52, and 54.

Figure 2:
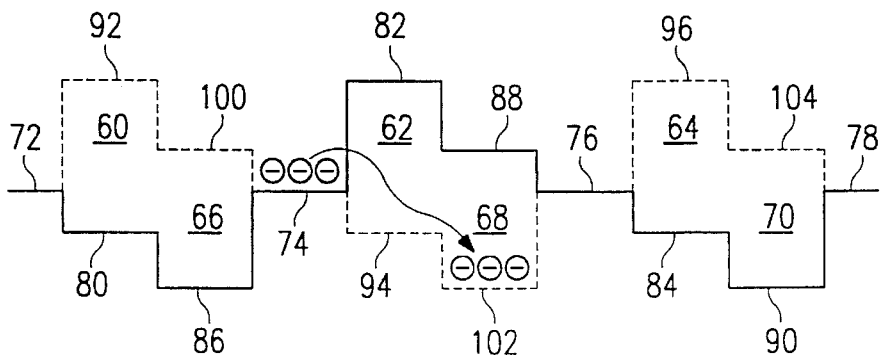
FIG. 2 is a diagram of the potential wells created by the device of FIG. 1.

A potential profile of the device of FIG. 1 is shown in FIG. 2 directly below the corresponding regions of the device of FIG. 1. This potential profile is for the potential maximum along the CCD channel (buried channel) in N type layer 22. The potential regions in FIG. 2 consist of virtual barriers 60, 62, and 64, virtual wells 66, 68, and 70, and bipolar gate regions 72, 74, 76, and 78. Each of the virtual barriers and virtual wells have two potential levels which are controlled by the clocked voltages $\phi_1$ and $\phi_2$. For proper charge flow in the preferred embodiment, $\phi_1$ and $\phi_2$ are clocked out of phase. When $\phi_1$ is high and $\phi_2$ is low, the virtual barriers 60, 62, and 64 are at potential levels 80, 82, and 84, and the virtual wells 66, 68, and 70 are at potential levels 86, 88, and 90. When $\phi_1$ is low and $\phi_2$ is high, the virtual barriers 60, 62, and 64 are at potential levels 92, 94, and 96, and the virtual wells 66, 68, and 70 are at potential levels 100, 102, and 104. The bipolar gate regions have only one potential level which is controlled by $V_{bias}$.

Figure 3:
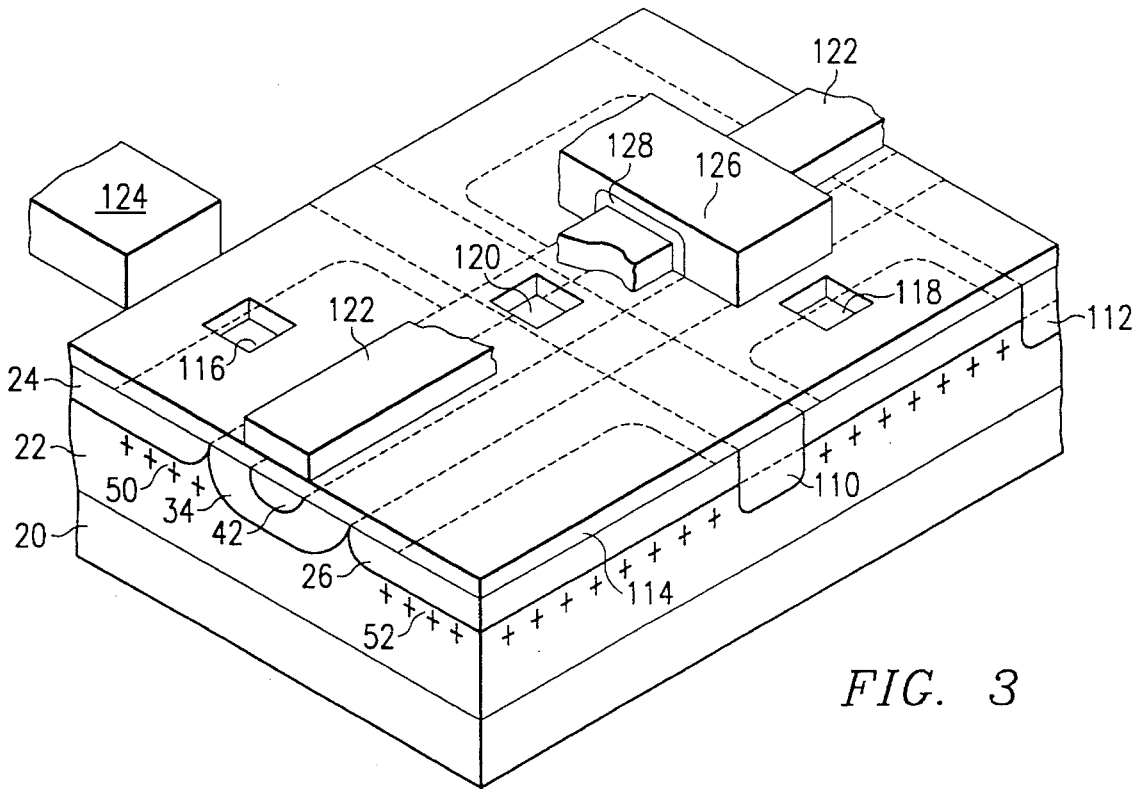
FIG. 3 is a perspective view of the device of FIG. 1.

FIG. 3 is a perspective view of the device of FIG. 1. In addition to the regions shown in FIG. 1, FIG. 3 also shows P type channel stop regions 110 and 112, insulator layer 114, contact holes 116, 118, and 120, polysilicon buss 122, metal buss 124, metal buss 126, and insulator layer 128. The channel stop regions 110 and 112 provide isolation between the charge transfer channels. Metal buss 124 supplies the clocked voltage $\phi_1$ to the virtual gate 24. Metal buss 126 provides the clocked voltage $\phi_2$ to the virtual gate 26. Polysilicon buss 122 supplies $V_{bias}$ to the bipolar gate 42. Insulator layer 128 isolates polysilicon buss 122 from metal busses 124 and 126.

The metal busses 124 and 126 and the polysilicon buss 122 do not have to be located as shown in FIG. 3. In an image sensing area, it is desirable to position the metal busses such that minimum light is obstructed. The preferred location of the metal busses in an image sensing area is over the channel stop regions 110 and 112. The contact holes would also be located over the channel stop regions. The busses 122, 124, and 126 could also be made of several possible materials such as polysilicon, silicides, and metals.

Figure 4:
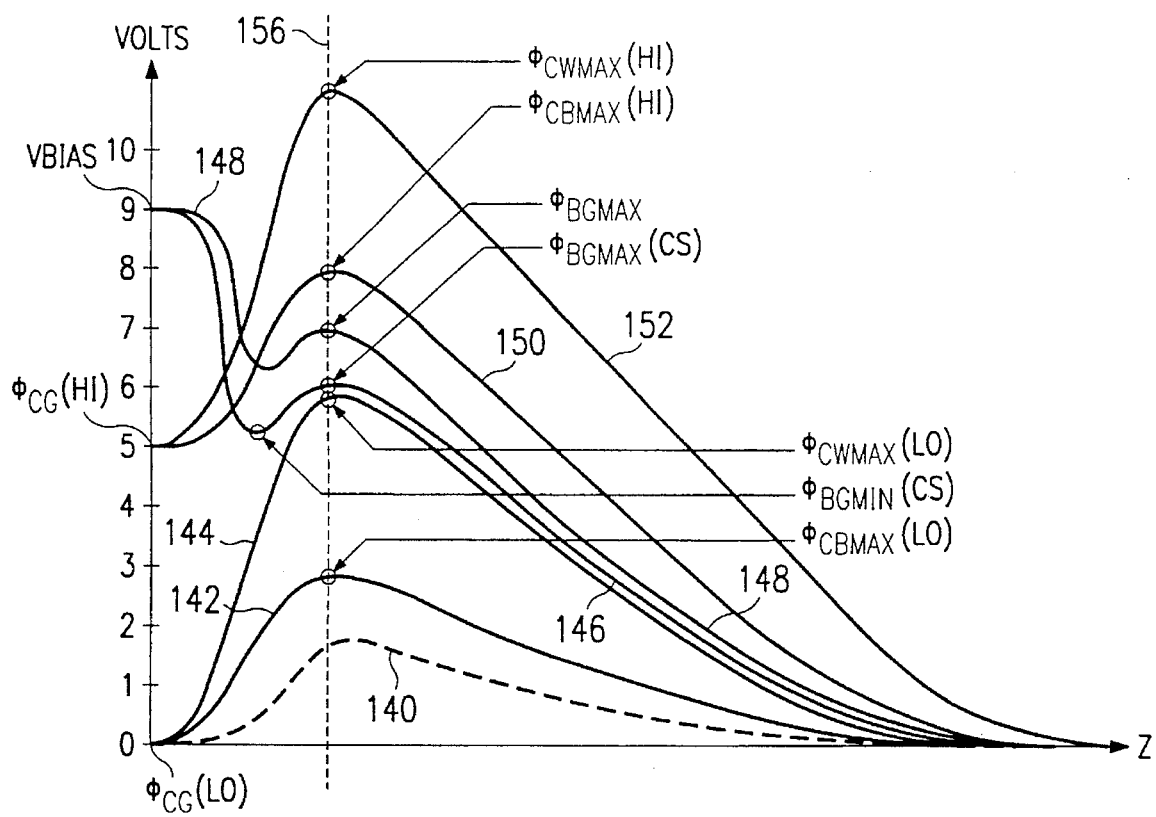
FIG. 4 is a diagram of the potential profiles, as a function of the distance from the surface of the semiconductor body, for the valence band of five regions of the device of FIG. 1.

There are five distinct regions which can be identified in the CCD cell and which have different potential profiles. FIG. 4 shows the potential profile for the valence band of each of these five regions, for a given clocked voltage on the virtual gate, as a function of the distance from the surface of the semiconductor body. The Z direction in FIG. 4 is the direction into the semiconductor, and begins at the surface of the semiconductor. Line 140 of FIG. 4 is the potential profile for virtual gate in the channel stop region with a clocked voltage of 0 volts with respect to the substrate. Line 142 is the potential profile for the virtual barrier with a clocked voltage of 0 volts. Line 144 is the potential profile for the clocked virtual well with a clocked voltage of 0 volts. Line 146 is the potential profile for the bipolar gate in the channel stop region with $V_{bias}$ at 9 volts with respect to the substrate. Line 148 is the potential profile for the bipolar gate in the transfer region with $V_{bias}$ at 9 volts. Line 150 is the potential profile for the clocked virtual barrier with a clocked voltage of 5 volts. Line 152 is the potential profile for the clocked virtual well with a clocked voltage of 5 volts. The potential profile shown in FIG. 2 is for the potentials along the dashed line 156 in FIG. 4. These potential profiles provide an understanding of how a charge packet is transferred along the CCD channel.

The operation of the device shown in FIGS. 1 and 3 will be described below and is illustrated by the potential profile shown in FIG. 2, directly below the corresponding regions of the device of FIG. 1. The potential levels for an electron in the buried channel (valence band maximum) are shown for the various regions of the device and for different bias levels of the virtual gates 24, 26, and 28. Starting with $\phi_1$ at a high voltage and $\phi_2$ at a low voltage, and an electron in the virtual barrier 60 at potential level 80, the operation is as follows. First the electron falls into the virtual well 66 at potential level 86. The electron will remain in the virtual well 66 because the potential levels of both adjacent regions are higher. When the virtual gate voltage $\phi_1$ is switched to a low voltage and $\phi_2$ is switched to a high voltage, the potential level of virtual well 66 changes to level 100. Then the electron passes from virtual well 66 into the bipolar gate region 74. The electron passes through the bipolar gate region 74 and the virtual barrier 62 at level 94, and falls into virtual well 68 at potential level 102. Movement of the electron further down the charge transfer channel is just a repeat of the same steps and clocking of the virtual gate voltages $\phi_1$ and $\phi_2$. The charge transfer channel is the region between two channel stop regions.

For proper operation of the preferred embodiment the following conditions between the various potentials, shown in FIG. 4, have to be satisfied.

(1) $\phi_{CBMAX}(HI)=\phi_{BGMAX}+\phi_{\Delta M1}$ (2) $\phi_{BGMAX}=\phi_{CWMAX}(LO)+\phi_{\Delta M2}$ (3) $\phi_{BGMIN}(CS)=\phi_{CG}(HG)+\phi_{\Delta M3}$ Since the maximum potential responds to the clocked virtual gate voltage, the following equation is a good approximation:

(4) $\phi_{CBMAX}(HI)\approx\phi_{CBMAX}(LO)+\Delta\phi_{CG}$ $\phi_{CBMAX}(HI)$, $\phi_{BGMAX}$, $\phi_{CWMAX}(LO)$, $\phi_{BGMIN}(CS)$, $\phi_{CBMAX}(LO)$, $\phi_{CG}(HI)$, and $\phi_{CG}(LO)$ are shown in FIG. 4. $\Delta\phi_{CG}$ is the difference between $\phi_{CG}(HI)$ and $\phi_{CG}(LO)$ which is the applied clock voltage swing. $\phi_{\Delta M1}$ is the margin for good charge transfer efficiency. $\phi_{\Delta M2}$ is the margin to ensure charge transfer from the virtual well to the bipolar gate region when the virtual gate voltage is low. $\phi_{\Delta M3}$ is the margin to prevent hole current flow between the P+ virtual gates.

Using equation (4) in equations (1) and (2), the following equation (5) for the maximum well capacity and the clock swing is derived.

(5) $\Delta\phi_{CG}=\phi_{CWMAX}(LO)-\phi_{CBMAX}(LO)+\phi_{\Delta M2}+\phi_{\Delta M1}$ ($\phi_{CWMAX}(LO)-\phi_{CBMAX}(LO)$) is related to well capacity. The condition in equation (3) limits the clock swing $\Delta\phi_{CG}$ to prevent current flow from one P+ virtual gate to another. From the equations above, it is seen that the channel stop implant and $\phi_{\Delta M2}$ and $\phi_{\Delta M1}$ must be minimized to obtain the maximum well capacity for this device.

Figure 5:
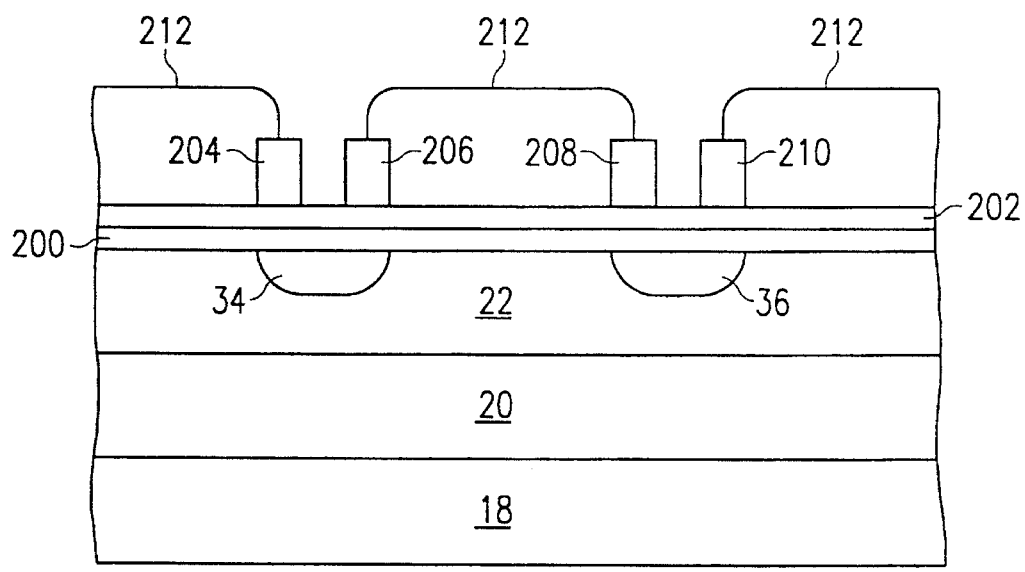
FIGS. 5 and 6 show the device of FIG. 1 at two stages of fabrication for a preferred embodiment method of fabrication.
Figure 6:
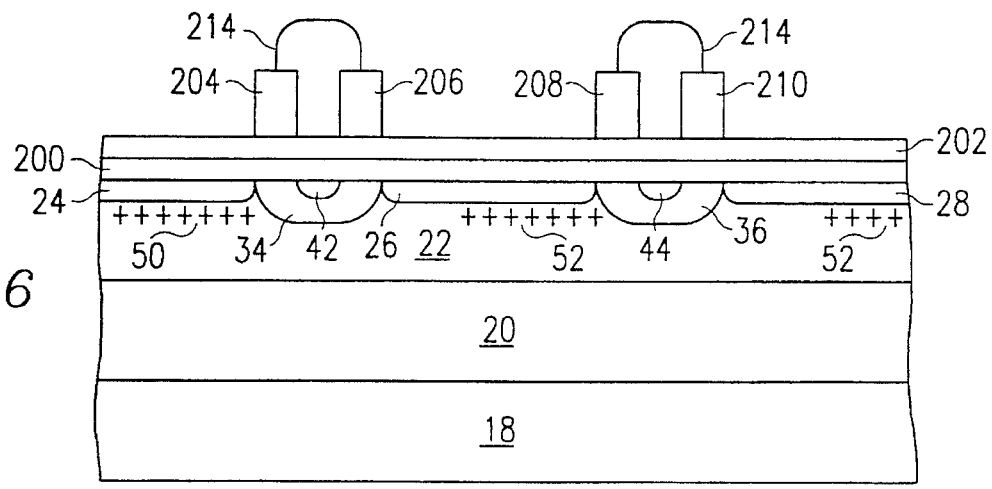

FIGS. 5 and 6 illustrate successive steps in a process for fabricating the first preferred embodiment of a bipolar gate CCD with clocked virtual phase, shown in FIG. 1. Referring first to FIG. 5, the process begins with a P+ silicon substrate 18. The substrate 18 is not shown in FIG. 1. Then a P type epitaxial layer 20 is grown over P+ type substrate 18. The P type epitaxial layer 20 has a desired thickness of, for example, 20 micrometers. Next, standard self aligned thick oxide (SATO) step sequences are applied to define the active region and peripheral region of the device. Then an oxide layer 200 is formed over the surface. Oxide layer 200 has a thickness of, for example, 400 angstroms. A nitride layer 202 having a thickness of about 200 angstroms, for example, is then deposited over the oxide layer 200. Next, N type buried channel layer 22 is implanted into P type epitaxial layer 20. A dopant such as phosphorus may be used as the implant dopant for N type layer 22. This implantation is followed by heat treatment to diffuse the implanted impurities further into the silicon as required to form N type buried channel layer 22, shown in FIG. 5.

An oxide layer having a thickness of about 6000 angstroms, for example, is then deposited on the surface of P type layer 22. This oxide layer is patterned and etched to form cap oxide regions 204, 206, 208, and 210 which define the locations of the virtual gates 24, 26, and 28, and the locations of the bipolar gates 42 and 44. Next, a photoresist layer 212 is used to pattern an implant into N type buried channel 22 to form P type regions 34 and 36. A dopant such as boron may be used as the implant dopant for P type regions 34 and 36. In a subsequent heat treatment, the implanted impurities are diffused further into the silicon as required to form P type regions 34 and 36, shown in FIG. 5. Through the same aperture, N+ bipolar gates 42 and 44 are then implanted using a dopant such as phosphorus.

Next, a photoresist layer is used to pattern an implant into N type buried channel 22 to form the donor implants 50, 52, and 54, shown in FIG. 6. This implant is done with an N type dopant such as phosphorous. Then a photoresist layer 214 is used to pattern an implant into N type buried channel 22 to form P+ virtual gates 24, 26, and 28. An implant dopant such as boron is used to form P+ virtual gates 24, 26, and 28. This is followed by the removal of the cap oxide regions 204, 206, 208, and 210. Next, P type channel stop regions 110 and 112, shown in FIG. 3, are patterned and implanted into the layer 22. A dopant such as boron may be used as the implant dopant for channel stop regions 110 and 112. Next, an oxide layer 114, shown in FIG. 3, having a thickness of about 2000 angstroms, for example, is deposited over the device. Then contact openings, such as the contact opening 120, shown in FIG. 3, to the bipolar gates are patterned and etched. This is followed by the deposition of a polysilicon layer 122, shown in FIG. 3, over oxide layer 114. Polysilicon layer 122 has a thickness on the order of 6000 angstroms, for example. Polysilicon layer 122 is then doped to be conductive. Next, polysilicon layer 122 is deglazed, patterned, and etched to form layer 122, as shown in FIG. 3. Then oxide layer 128, shown in FIG. 3, is deposited and has a thickness of about 5000 angstroms, for example. Contact openings to the virtual gates, such as contact openings 116 and 118, shown in FIG. 3, are patterned and etched in oxide layer 114. An implant is then made in the contact openings using an implant dopant such as boron. This implant is followed by an anneal. Then, after a deglaze, an Al—Si sputter deposition forms a metal layer over the surface to a thickness of, for example, about 11,000 angstroms. The metal layer is patterned and etched to form metal busses 124 and 126, shown in FIG. 3.

Figure 7:
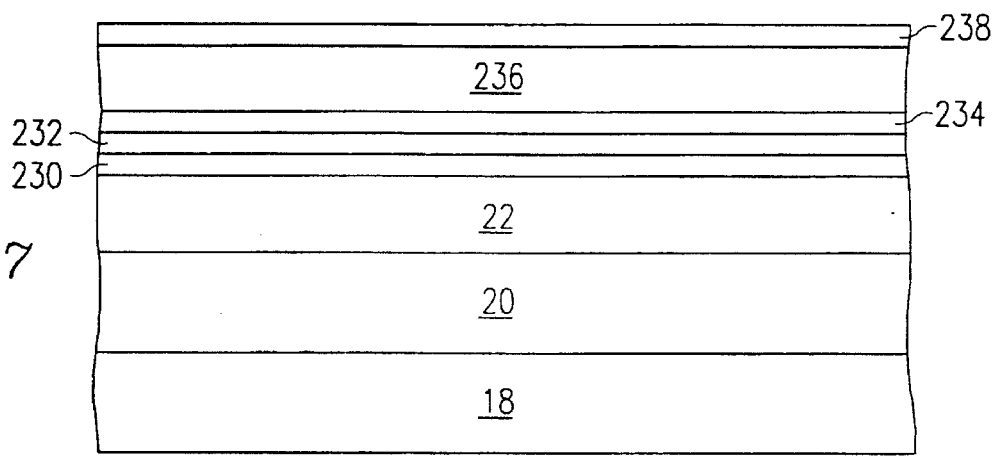
FIGS. 7–9 show the device of FIG. 1 at three stages of fabrication for an alternative embodiment method of fabrication.
Figure 8:
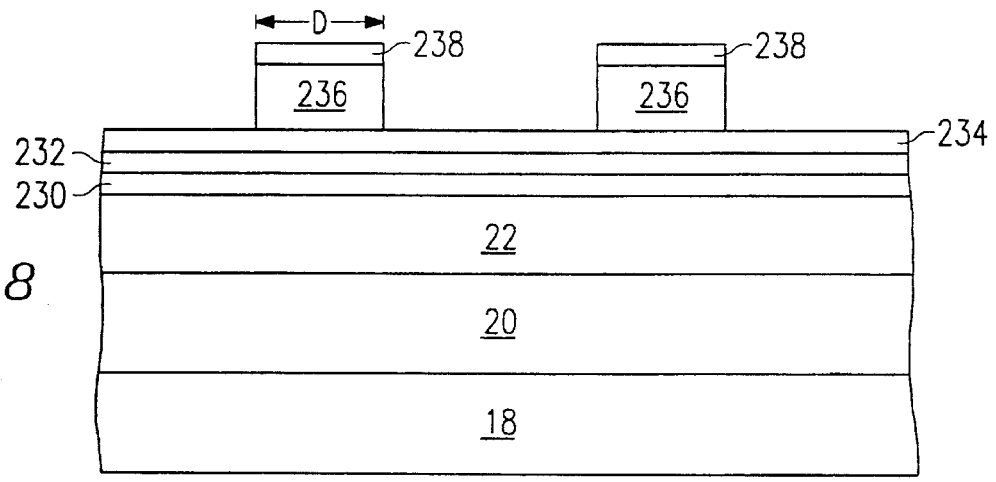
Figure 9:
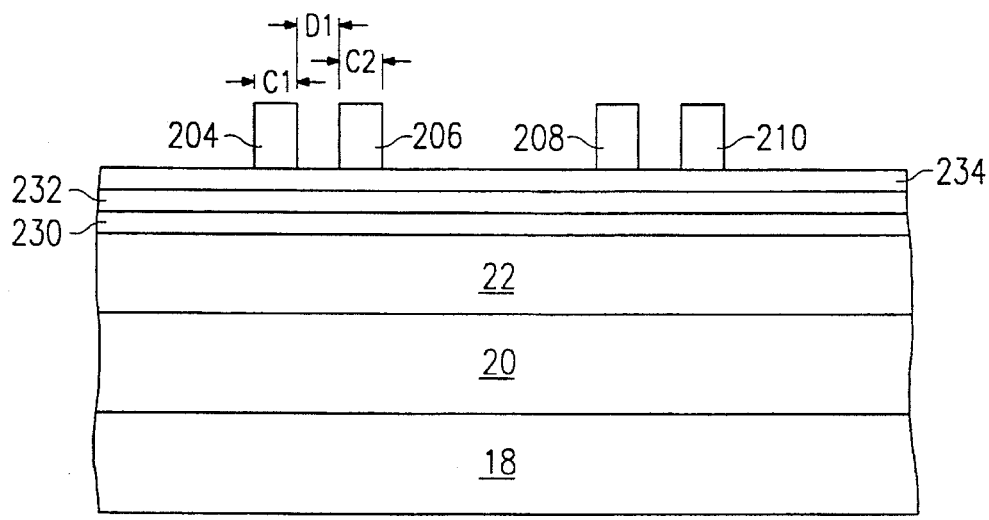

For small pixel devices, it is difficult to accurately provide the sub-micron patterns that control the spacings of the P+ virtual gates and the N+ bipolar gates. The following alternative process provides a reliable sub-micron process for controlling these spacings. In this alternative process for fabricating a first preferred embodiment of a bipolar gate CCD with clocked virtual phase, the cap oxide regions 204, 206, 208, and 210, described above, are formed in a different way, as shown in FIGS. 7–9. A sandwich of oxide 230, nitride 232, oxide 234, polysilicon 236, and nitride 238 is deposited over layer 22, as shown in FIG. 7. The polysilicon 236 has a preferred thickness of about 5000 angstroms. The top layer of nitride 238 and polysilicon 236 are patterned and etched to form the structure shown in FIG. 8. An example of the dimension D, shown in FIG. 8, is 1.6 micrometers. The polysilicon region 236 is then laterally oxidized to the desired width for the cap oxide regions. The nitride 238 and unoxidized polysilicon is then etched off to leave the cap oxide regions 204, 206, 208, and 210, as shown in FIG. 9. An example of the dimensions C1, C2, and D1, shown in FIG. 9, is 0.6 micrometers for C1 and C2, and 0.4 micrometers for D1. The bipolar gates and virtual gates are then formed as described above. In peripheral circuits, the nitride layer 232 can be left under the polysilicon gates.

Figure 10:
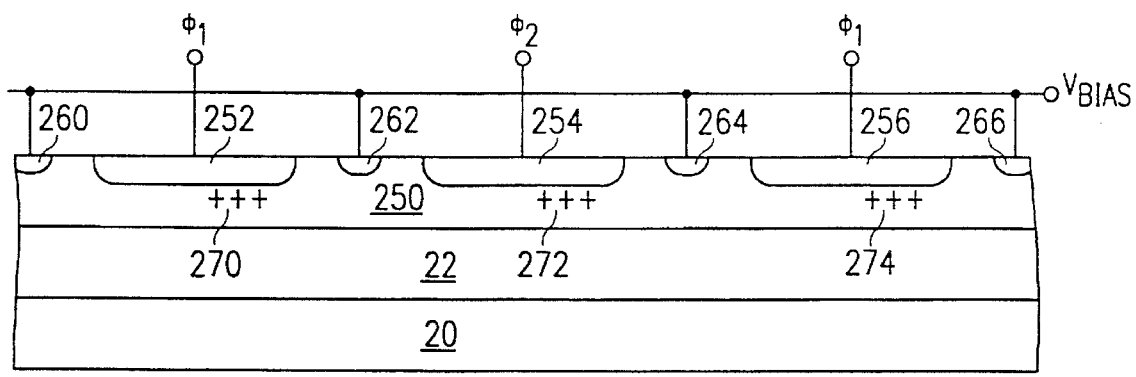
FIG. 10 is an alternative embodiment bipolar gate CCD with clocked virtual phase.

FIG. 10 is a cross-section of an alternative embodiment of a bipolar gate CCD with clocked virtual phase. The structure of FIG. 10 includes P type layer 20, N type buried channel 22 formed in layer 20, P type barrier layer 250, P+ virtual gates 252, 254, and 256, N+ bipolar gates 260, 262, 264, and 266, donor implants 270, 272, and 274 below virtual gates 252, 254, and 256, reference voltage $V_{bias}$ coupled to the bipolar gates 260, 262, 264, and 266, clocked voltage $\phi_1$ coupled to virtual gates 252 and 256, and clocked voltage $\phi_2$ coupled to virtual gate 254.

The operation of the device of FIG. 10 is the same as that described above for the device of FIG. 1. The difference between the device of FIG. 1 and the device of FIG. 10 is the P type barrier layer 250 in FIG. 10 and the P type regions 32, 34, 36, and 38 in FIG. 1. The device could also have the P type regions of FIG. 1 and the barrier layer of FIG. 10 combined in various proportions to obtain more flexibility and control of potentials in each region.

The embodiments described above provide several advantages. Some of those advantages are listed below. A first advantage is that only a positive clock swing is necessary for the virtual gates. This allows easy integration with CMOS logic circuits on the same chip. It is possible to create a 5.0 volt integrated system with a potential to go to 3.3 volts and lower. A second advantage is that MOS gates are not required for this device. This eliminates gate oxide shorts and provides automatic electrostatic discharge protection. This advantage is also important for ionizing environments such as those where ionizing radiation charges up gate oxides and causes device failures. A third advantage is that surface state generated dark current, which is a major dark current source in many prior art CCD devices, is not present in the bipolar gate CCD. Both P+ virtual gate regions and N+ bipolar gate regions are doped such that the surface states are always filled with carriers. A fourth advantage is high quantum efficiency. The only region which is optically inactive is the N+ bipolar gate electrode. This region is, however, very small and shallow. The rest of the structure is optically active and light generated carriers are collected in the CCD wells. A fifth advantage is the variety of common CCD structures that can be built with this technology. This includes full frame CCD, frame transfer CCD, interline transfer CCD, frame-interline transfer CCD, and line addressable CCD. Various linear CCD's can also be built.

In the embodiments described above, various items have been omitted for simplicity such as protective oxides, metallizations, and connections.

A few preferred embodiments have been described in detail hereinabove. It is to be understood that the scope of the invention also comprehends embodiments different from those described, yet within the scope of the claims.

For example, the embodiments may be modified in various ways such as varying the doping levels, type of doping, materials, and dimensions.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating a bipolar gate charge coupled device comprising:

forming a semiconductor layer of a first conductivity type;

forming a buried channel of a second conductivity type in the semiconductor layer;

forming semiconductor regions over the buried channel;

laterally oxidizing the semiconductor regions to a desired width;

etching off the semiconductor regions to leave cap oxide regions;

forming bipolar gates in the buried channel at locations defined by the cap oxide regions; and forming virtual gates in the buried channel adjacent the bipolar gates at locations defined by the cap oxide regions.

2. The method of claim 1 further comprising forming donor impurities under a portion of each virtual gate.

3. The method of claim 1 wherein the bipolar gates are of the second conductivity type and the virtual gates are of the first conductivity type.

4. The method of claim 3 further comprising forming doped regions of the first conductivity type which separate the bipolar gates from the virtual gates and from the buried channel.

* * * * *